(12) United States Patent
Treharne (10) Patent No.: US 9,639,996 B2
(45) Date of Patent: May 2, 2017

(54) VEHICLE DIAGNOSTICS APPARATUS AND METHOD

(71) Applicant: JAGUAR LAND ROVER LIMITED, Warwickshire (GB)

(72) Inventor: Jason Treharne, Coventry (GB)

(73) Assignee: Jaguar Land Rover Limited, Whitley, Coventry (GB)

(*) Notice: Subject to any disclaimer, the term of this patent is extended or adjusted under 35 U.S.C. 154(b) by 0 days.

(21) Appl. No.: 14/765,101

(22) PCT Filed: Jan. 31, 2014

(86) PCT No.: PCT/EP2014/051924
§ 371 (c)(1),
(2) Date: Jul. 31, 2015

(87) PCT Pub. No.: WO2014/118327
PCT Pub. Date: Aug. 7, 2014

(65) Prior Publication Data
US 2015/0371461 A1 Dec. 24, 2015

(30) Foreign Application Priority Data
Feb. 1, 2013 (GB) .................................. 1301803.1

(51) Int. Cl.
*G06F 7/00* (2006.01)
*G06F 11/30* (2006.01)
(Continued)

(52) U.S. Cl.
CPC ......... *G07C 5/0808* (2013.01); *G01R 31/007* (2013.01); *G07C 5/008* (2013.01);
(Continued)

(58) Field of Classification Search
USPC .......................... 701/31.4; 702/182; 717/124
See application file for complete search history.

(56) References Cited

U.S. PATENT DOCUMENTS 5,214,582 A 5/1993 Gray
5,318,449 A 6/1994 Schoell et al.
(Continued)

FOREIGN PATENT DOCUMENTS

CN 102494754 6/2012
EP 1116955 A2 7/2001
(Continued)

OTHER PUBLICATIONS

Combined Search and Examination Report under Sections 17 and 18(3) for Application No. GB1307527.0 dated Nov. 27, 2013.
(Continued)

*Primary Examiner* — Tyler Paige
(74) *Attorney, Agent, or Firm* — Carlson, Gaskey & Olds (57) ABSTRACT

A motor vehicle diagnostics apparatus (110, 152) having a diagnostics unit connectable in-line in a motor vehicle control system between first and second components (171, 172), the apparatus (110, 152) being operable to detect by means of the diagnostics unit (110) one or more electrical signals generated by the first component (171) for application to the second component (172) and to provide an output in response to the detected signals.

23 Claims, 6 Drawing Sheets

(51) Int. Cl.
*G06F 9/44* (2006.01)
*G07C 5/08* (2006.01)
*G01R 31/00* (2006.01)
*G07C 5/00* (2006.01)
*G01R 31/02* (2006.01)

(52) U.S. Cl.
CPC ......... *G07C 5/0816* (2013.01); *G07C 5/0825* (2013.01); *G07C 5/0833* (2013.01); *G01R 31/025* (2013.01)

(56) References Cited

U.S. PATENT DOCUMENTS

| | | | |
|---|---|---|---|
| 5,532,927 A | | 7/1996 | Pink et al. |
| 5,798,647 A | | 8/1998 | Martin et al. |
| 6,055,468 A | | 4/2000 | Kaman et al. |
| 6,481,271 B1 | | 11/2002 | Ward et al. |
| 7,913,242 B2 * | | 3/2011 | Holland ............... G06F 8/65 701/1 |
| 2003/0088346 A1 | | 5/2003 | Calkins et al. |
| 2003/0216889 A1 * | | 11/2003 | Marko ............... G07C 5/0808 702/182 |
| 2004/0138790 A1 * | | 7/2004 | Kapolka ............... G07C 5/008 701/29.3 |
| 2004/0239516 A1 | | 12/2004 | Jones et al. |
| 2005/0034540 A1 | | 2/2005 | Juranitch et al. |
| 2005/0049835 A1 | | 3/2005 | Mayer et al. |
| 2006/0106510 A1 * | | 5/2006 | Heffington ......... B60R 16/0231 701/29.6 |
| 2007/0028220 A1 * | | 2/2007 | Miller ............... G05B 23/0278 717/124 |
| 2008/0297334 A1 | | 12/2008 | Siavoshai et al. |
| 2010/0049395 A1 | | 2/2010 | Duddle et al. |
| 2010/0205450 A1 * | 8/2010 | Sarnacke ............. G07C 5/0808 713/185 |
| 2012/0041638 A1 * | 2/2012 | Johnson ............... G07C 5/008 701/33.1 |
| 2013/0066512 A1 * | 3/2013 | Willard ................ B60T 17/221 701/29.1 |
| 2014/0005881 A1 * | 1/2014 | Hardesty ............... F02D 41/22 701/32.8 |
| 2014/0075356 A1 * | 3/2014 | Gray .................... G07C 5/008 715/771 |
| 2015/0371461 A1 * | 12/2015 | Treharne ............. G01R 31/007 701/31.4 |
| 2016/0071336 A1 * | 3/2016 | Owen ................. G07C 5/0808 701/31.4 |

FOREIGN PATENT DOCUMENTS

| | | |
|---|---|---|
| EP | 0913694 | 12/2003 |
| EP | 1978490 | 10/2008 |
| GB | 2221544 A | 2/1990 |
| WO | 2007027702 A2 | 3/2007 |

OTHER PUBLICATIONS

Search Report under Section 17(6) for Application No. GB1307527.0 dated Apr. 10, 2014.
The International Search Report for PCT Application No. PCT/EP2014/057918, mailed Apr. 28, 2014.
Combined Search and Examination Report under Sections 17 and 18(3) for Application No. GB1502332.8 dated Feb. 19, 2015.
International Search Report for International application No. PCT/EP2014/051924 mailed Apr. 28, 2014.
Combined Search and Examination Report under Sections 17 and 18(3) for Application No. GB1301803.1 dated Jun. 31, 2013.

* cited by examiner

VEHICLE DIAGNOSTICS APPARATUS AND METHOD

TECHNICAL FIELD

The present invention relates to vehicle diagnostics apparatus and to a method of diagnosing a vehicle fault. Aspects of the invention relate to an apparatus, to a method and to a vehicle.

BACKGROUND

It is known to provide a vehicle diagnostics apparatus that connects to a diagnostics input port of a motor vehicle to facilitate interrogation of a vehicle electronic control unit (ECU). Known diagnostics apparatus is configured to read fault codes that are stored in a memory of the ECU when the ECU determines that a fault has occurred. The diagnostics apparatus typically provides an output to an operator indicative of the fault codes identified by the apparatus.

Known diagnostics apparatus may be operable to command an ECU to which it is connected via the diagnostics port to perform a particular diagnostic test and to read back from the ECU a result of the test.

A problem with known diagnostics apparatus is that it is only able to facilitate diagnosis of a fault by reference to an output provided by the diagnostics port alone. The apparatus may be unable to determine whether the output from the ECU provides a correct indication of the presence (or absence) of a fault. Furthermore, in the event a fault is determined to exist, the diagnostics apparatus may be unable to determine where the fault is located.

It is an aim of the present invention to address disadvantages associated with the prior art.

SUMMARY OF THE INVENTION

Embodiments of the invention may be understood with reference to the appended claims.

Aspects of the present invention provide an apparatus, a vehicle and a method.

In a further aspect of the invention for which protection is sought there is provided a motor vehicle diagnostics apparatus having a diagnostics unit connectable in-line in a motor vehicle control system between first and second components, the apparatus being operable to detect by means of the diagnostics unit one or more electrical signals generated by the first component for application to the second component and to provide an output in response to the detected signals.

Embodiments of the invention have the advantage that the apparatus is able to monitor signals associated with a motor vehicle control system to enable a user to determine whether the control system is functioning correctly. For example a user may be able to determine an origin of a fault or other feature associated with a vehicle.

The apparatus may be operable to present a substantially high impedance to the second component thereby substantially to isolate the second component from the control system.

The apparatus may be connectable to a harness of the control system in-line between the first and second components.

By harness is meant an assembly of cables or wires forming electrical connections between components of a motor vehicle control system.

It is to be understood that in some embodiments the apparatus may be arranged to allow a vehicle component to be disconnected from the vehicle harness and the harness connected to the diagnostics unit. The diagnostics unit may be connected to the component that was disconnected from the harness, so that the diagnostics unit is connected electrically 'in-line' between the first and second components. It is to be understood that the diagnostics apparatus may be located physically at any suitable location, provided it is provided with respective electrical connections to the first and second components respectively so that it can be connected to both components.

This feature has the advantage that the apparatus is able to monitor signals applied to a component via the harness and to determine whether the signals correspond to expected signals. This allows an operator to perform a check as to whether the harness and the component of the vehicle are functioning correctly.

It is to be understood that reference to 'application' of a signal to a component includes transmission of data to a component via a communications signal line, as well as application of (for example) power to a component via a substantially static power supply signal line. Thus, reference to a signal line includes reference to a line used to transmit power to a component, such as from a 12V power source, a ground (e.g. 0V) line or any other electrical line.

Thus, a signal line may not necessarily be used by a vehicle control system for signalling in the sense of communicating a state of a component to another component, providing a control signal to a component, or communicating digital data to a component.

The apparatus may be further operable to detect by means of the diagnostics unit one or more electrical signals generated by the second component for application to the first component and to provide an output in response to the detected signals.

Advantageously the apparatus may be operable to log data in respect of the signals detected.

The apparatus may be operable to provide an indication whether the detected signals correspond to expected signals by reference to data in respect of expected signals.

The apparatus may be operable to provide a visual indication of a correspondence between a form of a signal detected by the diagnostics unit and an expected form of the signal.

The visual indication may be in the form of a graphical plot of the signal as a function of time. An expected form of the signal may be superimposed on the graphical plot in some embodiments.

The apparatus may be operable to provide a visual or audible indication whether a value of at least one characteristic of a detected signal is within a prescribed range of values of that characteristic.

This feature has the advantage that a user can determine when a signal transmitted through the harness is within the prescribed range. This can assist a user in determining the location of a fault in the harness. For example, a user can manipulate (e.g. 'wiggle') cabling forming the harness and monitor the value of at least one characteristic of a detected signal. If the characteristic is outside of the prescribed range of values the apparatus provides a visual or audible alert. Thus, for example if a signal is expected to have a value in the range +/−5V the apparatus may be configured to provide a visual or audible alert if the value rises above 5V or falls below −5V. Similarly, if a signal is expected to have a value of at least 10V, the apparatus may be configured to provide a visual or audible alert if the value falls below 10V. Other arrangements are also useful.

The apparatus may be operable to provide the visual or audible indication by reference to the data in respect of expected signals.

The apparatus may be further connectable to an input portion of a vehicle controller, the apparatus being operable to provide one or more communications signals to the controller.

The vehicle controller may perform a diagnostic test in response to the one or more signals provided by the apparatus. Optionally, the control system may issue one or more commands to one or more controllers and/or components in response to the one or more signals provided by the apparatus.

The input portion may be an external communications port of a vehicle control system.

The apparatus may be operable to correlate communications signals provided to the controller by the apparatus with signals detected by the diagnostics unit.

The apparatus may be operable to download data from the vehicle controller.

The apparatus may be operable to download data comprising a fault code.

The apparatus may further comprise a diagnostics control module connectable to the diagnostics unit.

The control module may be operable to log the data in respect of the signals detected by the diagnostics unit.

The diagnostics control module may be connectable to the input portion of the vehicle controller, the module being operable to provide the one or more control signals to the controller.

The apparatus may be operable to generate one or more signals for application to the first component.

It is to be understood that in the case the unit is connected to the first component via the harness, the signal may be applied by the unit to the first component via the harness.

The apparatus may be operable to generate one or more signals to simulate one or more signals that may be generated by the second component and to apply the one or more signals to the first component.

The apparatus may be operable to apply the one or more signals to the first component with the second component disconnected from the unit.

Thus the apparatus may be operable to provide an end node function in which the apparatus simulates the presence of the second component. This feature may allow the apparatus to verify that the vehicle control system responds correctly to signals that would be generated by a correctly functioning second component. Alternatively or in addition the apparatus may be operable to simulate a faulty second component by generating signals that would be generated by a second component having a given fault.

The apparatus may be operable in use to apply the one or more signals to the first component via the harness.

The apparatus may be operable to communicate with a controller area network bus.

The apparatus may be operable to transmit via the controller area network bus one or more messages that may otherwise be transmitted by a component thereby to simulate operation of the component.

The diagnostics unit may be operable to apply one or more electrical signals to the second component.

The apparatus may be operable to monitor at least one characteristic of one or more signals generated by the second component as a function of time in response to the one or more signals applied thereto by the unit.

This feature has the advantage that the apparatus may be operable to test a component to check correct operation of the component. In some embodiments the apparatus may be operable to perform a component test in which the component is disconnected from the motor vehicle harness and connected to the diagnostics unit, with the diagnostics unit not connected to the first component. The diagnostics unit may then be operated to generate the one or more signals and apply them to the second component. The second component may be a controller or a controlled component, for example an exhaust gas recirculation (EGR) valve or any other suitable component.

The apparatus may be operable to provide an output indicative of whether the at least one characteristic of the one or more signals generated by the second component as a function of time corresponds to an expected characteristic.

The apparatus may be operable to monitor at least one characteristic associated with a signal applied to the second component as a function of time and to provide an output indicative of whether the at least one characteristic corresponds to an expected characteristic.

In one aspect of the invention for which protection is sought there is provided apparatus according to the preceding aspect coupled electrically to a motor vehicle.

In an aspect of the invention for which protection is sought there is provided a method of diagnosing a fault associated with a motor vehicle by means of diagnostics apparatus comprising: connecting a diagnostics unit of the apparatus in-line in a motor vehicle control system between first and second components; detecting by means of the diagnostics unit one or more electrical signals generated by the first component for application to the second component; and providing an output corresponding to the detected signals.

The method may comprise further connecting the apparatus to an input portion of a vehicle controller, and providing one or more communications signals to the controller.

In one aspect of the invention for which protection is sought there is provided a motor vehicle diagnostics apparatus having an in-line diagnostics unit connectable in a harness of a motor vehicle, the apparatus being operable to detect by means of the diagnostics unit electrical signals applied to the harness and to log data in respect of the signals detected.

This feature has the advantage that the apparatus is able to monitor signals applied to a component via the harness and determine whether the signals correspond to expected signals. This allows an operator to check that a harness of the vehicle is functioning correctly.

In a further aspect of the invention for which protection is sought there is provided a motor vehicle diagnostics apparatus having a diagnostics unit connectable to one or more signal lines of a harness connector portion of a component of a motor vehicle, the unit being operable to apply an electrical potential to the one or more signal lines of the connector portion and to monitor a response of the component to the electrical potential.

It is to be understood that by the term harness connector portion is meant a connector portion of a component for connecting a component to the harness of the motor vehicle. In some embodiments the connector portion may be supported by a body of the component. In some embodiments the connector portion may be, or may be provided at, a free end of a cable connected to the component. Other arrangements are also useful.

Thus the apparatus may be connectable to a component of a motor vehicle with the component disconnected from the harness. Thus in some embodiments a 'component only' test may be performed. This feature allows an operator to distinguish between harness faults and component faults.

The apparatus may be configured to apply an electrical potential (static or changing) to an electrical signal line of the harness connector portion of the component, and to monitor a potential of that signal line and/or one or more other signal lines. The apparatus may be configured to monitor an amount of current passing through one or more signal lines when an electrical potential (which may be a ground reference potential or a non-zero reference potential) is applied thereto.

The apparatus may be operable to log data in respect of a potential of one or more signal lines and/or an amount of current flowing through one or more signal lines.

In one aspect of the invention for which protection is sought there is provided a motor vehicle diagnostics apparatus having an in-line diagnostics unit connectable in a harness of a motor vehicle between first and second components, the apparatus being operable to detect by means of the diagnostics unit signals transmitted through the harness and to log data in respect of the signals detected.

In a further aspect of the invention for which protection is sought there is provided a motor vehicle diagnostics apparatus having a diagnostics unit connectable to a component of a motor vehicle, the unit being operable to apply an electrical potential to the one or more signal lines of the harness input and to monitor a response of the component to the electrical potential.

In one aspect of the invention there is provided a motor vehicle diagnostics apparatus having a diagnostics unit connectable to a motor vehicle control system, the apparatus being operable to detect by means of the diagnostics unit electrical signals generated by one or more components of the control system for application via a harness of the vehicle to one or more other components, the apparatus being operable to log data in respect of the signals detected and to provide an output indicative of whether the detected signals correspond to expected signals by reference to data in respect of the expected signals.

In one arrangement the diagnostics unit may be connected to a harness of the vehicle to provide an end node to test harness functioning.

In a further aspect of the invention for which protection is sought there is provided a method of diagnosing a fault associated with a motor vehicle by means of diagnostics apparatus comprising: connecting a diagnostics unit of the apparatus in a harness of a motor vehicle;

detecting by means of the diagnostics unit electrical signals applied to the harness; and logging data in respect of the signals detected, the apparatus being operable to provide an indication whether the detected signals correspond to expected signals by reference to data in respect of expected signals.

In one aspect of the invention for which protection is sought there is provided a motor vehicle diagnostics apparatus having a diagnostics unit connectable in-line in a motor vehicle control system between first and second components, the apparatus being operable to detect by means of the diagnostics unit one or more electrical signals generated by the first component for application to the second component and to provide an output corresponding to the detected signals.

Within the scope of this application it is expressly intended that the various aspects, embodiments, examples and alternatives set out in the preceding paragraphs, in the claims and/or in the following description and drawings, and in particular the individual features thereof, may be taken independently or in any combination. Features described with reference to one embodiment are applicable to all embodiments, unless such features are incompatible.

For the avoidance of doubt, it is to be understood that features described with respect to one aspect of the invention may be included within any other aspect of the invention, alone or in appropriate combination with one or more other features.

BRIEF DESCRIPTION OF THE DRAWINGS

One or more embodiments of the invention will now be described, by way of example only, with reference to the accompanying figures in which.

DETAILED DESCRIPTION

Figure 1:
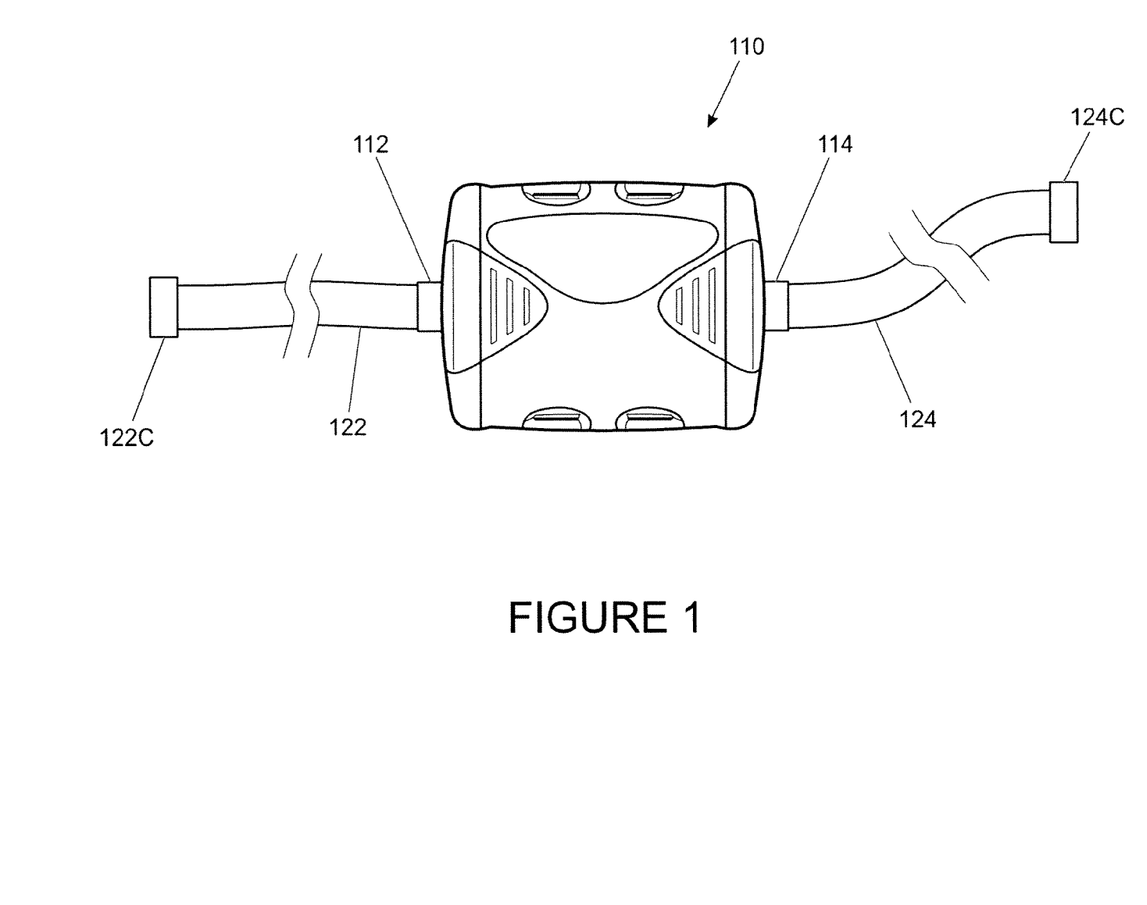
FIG. 1 is a schematic illustration of diagnostics unit of a diagnostics apparatus according to an embodiment of the present invention.

Embodiments of the present invention are directed to providing a diagnostics apparatus for diagnosing a fault with a motor vehicle. FIG. 1 shows a diagnostics unit 110 for use with diagnostics apparatus according to one embodiment of the invention. The unit 110 has first and second connector ports 112, 114 allowing connection of the unit 110 to first and second cables 122, 124 respectively. The cables 122, 124 each have a respective connector 122C, 124C allowing the unit 110 to be connected to a harness 170H of a motor vehicle 170 (see FIG. 2) between the harness 170H and a component to which the harness is connected. Other arrangements are also useful.

The unit 110 is designed to be connected to the harness 170H of a motor vehicle 170 such that signals transmitted through the harness 170H to or from the component pass substantially straight through the unit 110 from the first connector port 112 to the second connector port 114 or from the second connector port 114 to the first connector port 112.

The unit 110 is designed to be substantially 'invisible' to the vehicle control system in the sense that the vehicle control system functions in substantially the same way regardless of whether or not the unit 110 is connected to the harness 170H. This is achieved by ensuring that the module 110 may present a relatively low impedance to signals transmitted along the harness 170H and through the unit 110.

The harness 170H of the motor vehicle 170 may include any number of signal lines but in the embodiment of FIG. 1 the unit 110 is configured for connection to a harness 170H having up to 10 signal lines.

It is to be understood that one or more of the signal lines of the harness 170H may be arranged to carry communications signals such as controller area network (CAN) bus signals or the like. Alternatively or in addition one or more signal lines of the harness 170H may provide a power line such as a 5V or 12V power line and/or a ground line. In some vehicles, one or more signal lines may be arranged to carry signals for actuating or otherwise controlling a component such as a pulse width modulation (PWM) signal for actuating a motor or other device or system.

In order to enable the unit 110 to monitor the signal lines for correct functioning of the harness 170H and/or one or more components connected thereto, the unit 110 is provided with ten analogue input channels by means of which the voltage at a particular signal line and an amount of current flowing through a particular signal line may be measured. In addition, the unit 110 has four additional analogue channels (two oscilloscope channels and two multimeter channels) and four digital channels. The digital channels are each operable to detect and read data signals transmitted along a communications signal line such as a controller area network (CAN) bus signal line or a LIN bus signal line. For example, the channels may be configured to read data transmitted along CAN A and/or CAN B signal lines, and/or LIN1 and/or LIN2 signal lines of a vehicle harness. Other data signal lines can also be monitored in some embodiments.

The unit 110 is operable to monitor signals applied to the first connector port 112 or the second connector port 114. In some embodiments the unit 110 is also operable to generate signals for application to electrical lines of the first or second connector ports 112, 114 such as powerline signals and/or component actuation signals (such as PWM actuation signals).

It is to be understood that the unit 110 may generate signals in this manner for example in order to test a response of a component connected to the unit 110 to the signal.

In some embodiments the unit 110 may be operable to generate digital signals reproducing a CAN bus signal and/or a LIN bus signal, and apply the digital signal to one or more of the signal lines of a connector port 112, 114 as described below.

Figure 2:
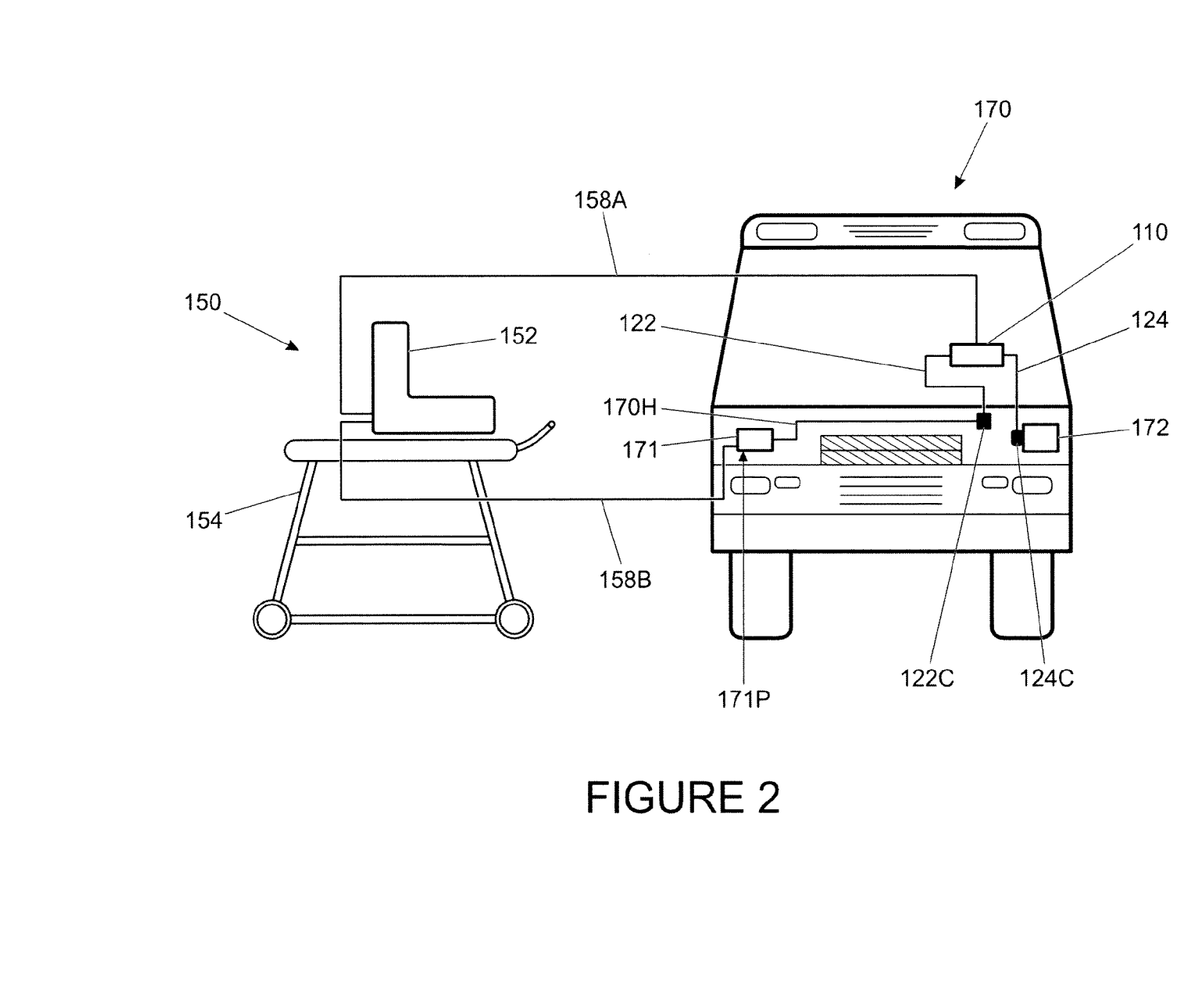
FIG. 2 is a schematic illustration of a diagnostics apparatus according to an embodiment of the invention connected to a harness of a motor vehicle.

The unit 110 is connectable to an external control module 150 shown in FIG. 2. The control module 150 is in the form of a laptop computing device 152 attached to a mobile cart 154 in the embodiment shown although other arrangements are also useful. The device 152 is configured to be connected to the unit 110 by means of a Universal Serial Bus (USB) connection although other interfaces are also useful.

FIG. 2 shows the diagnostics unit 110 connected in the harness 170H of the motor vehicle 170. In the example shown, a vehicle electronic control unit (ECU) 171 is connected to a controlled component 172 by means of the harness 170H, the controlled component 172 being a turbocharger unit 172 in the arrangement illustrated. The harness 170H is shown having been disconnected from the turbocharger unit 172 in order to connect the diagnostics unit 110 into the harness 170H. The first cable 122 of the diagnostics unit 110 has been connected to the harness 170H and the second cable 124 of the diagnostics unit 110 has been connected to the turbocharger unit 172. The diagnostics unit 110 has been connected to the computing device 152 by means of a first USB cable 158A to allow data to be transmitted between the diagnostics unit 110 and computing device 152. The computing device 152 has also been connected to a diagnostics port 171P of the ECU 171 by means of a second USB cable 158B, allowing communication between the computing device 152 and ECU 171. It is to be understood that in some embodiments one or more other means for communication between the computing device 152 and diagnostics unit 110 and/or ECU 171 may be provided in addition or instead, such as an Ethernet communications connection, a wireless connection such as Bluetooth® or any other suitable connection.

The computing device 152 is operable to run a diagnostic test program to determine whether the turbocharger unit 172 is functioning correctly. When a test program is loaded and run by the computing device 152, the computing device 152 issues control commands to the ECU 171 via second USB cable 158B, causing the ECU 171 to perform the diagnostic test. According to a test program implemented in one embodiment, the ECU 171 is commanded to apply electrical power to the turbocharger unit 172 via one or more signal lines of the harness 170H in order to cause the variable vanes of the turbocharger unit 172 to actuate.

When the ECU 171 is commanded by the computing device 152 to apply power to the turbocharger unit 172 in this manner, the computing device 152 checks whether the diagnostic unit 110 has detected the supply of power to the turbocharger unit 172 via the harness 170H. The computing device 152 checks that the correct potential difference has been applied to each signal line of the harness 170H. In some embodiments the computing device 152 does this by interrogating the diagnostics unit 110. In some alternative embodiments, in addition or instead the computing device 152 does this by reference to data received from the unit 110 and stored in the computing device 152. The computing device 152 also checks that the amount of current drawn by each signal line corresponds to an expected amount.

For each test program that the computing device 152 may perform, the computing device 152 is provided with data corresponding to an expected range of the potential difference applied to a given signal line of the harness 170H and/or an expected range of values of current that may flow through a given signal line in the case that the component to which the unit 110 is connected is correctly functioning.

The computing device 152 may be operable to perform a plurality of diagnostics tests in respect of the turbocharger unit 172, and provide an output indicating whether the potential differences and currents measured by the diagnostics unit correspond to those expected of a correctly functioning turbocharger unit 172.

If one or more of the tests indicates the turbocharger unit 172 is not functioning correctly, the computing device 152 may provide an output indicating the likely problem with the unit 172. Thus, based on the currents and potential differences measured, the computing device 152 may be able to diagnose the problem with the unit 172, or provide an indication of one or more problems that may exist based on the measured data.

In some embodiments, in addition to performing in-line tests with the diagnostics unit 110 connected to the harness 170H, the apparatus may be operable to perform a component test in which the diagnostics unit 110 is disconnected from the harness 170H but connected to a component. This feature has the advantage that a test may be performed the results of which are independent of a state of the vehicle harness 170H. Thus, if a problem exists with the harness 170H but the component is correctly functioning, the computing device 152 is able to determine that the component is correctly functioning and enable the fault to be diagnosed as one associated with the harness 170H or another component of the vehicle 170.

When the unit 110 is connected in-line in the vehicle control system, in some embodiments the unit 110 may be arranged to draw power from the control system via the first and/or second connector portions 112, 114 in order to operate. Alternatively the unit 110 may be provided with power from an external source such as an external power supply unit. In some embodiments the unit 110 may be provided with one or more internal or external batteries.

Figure 3:
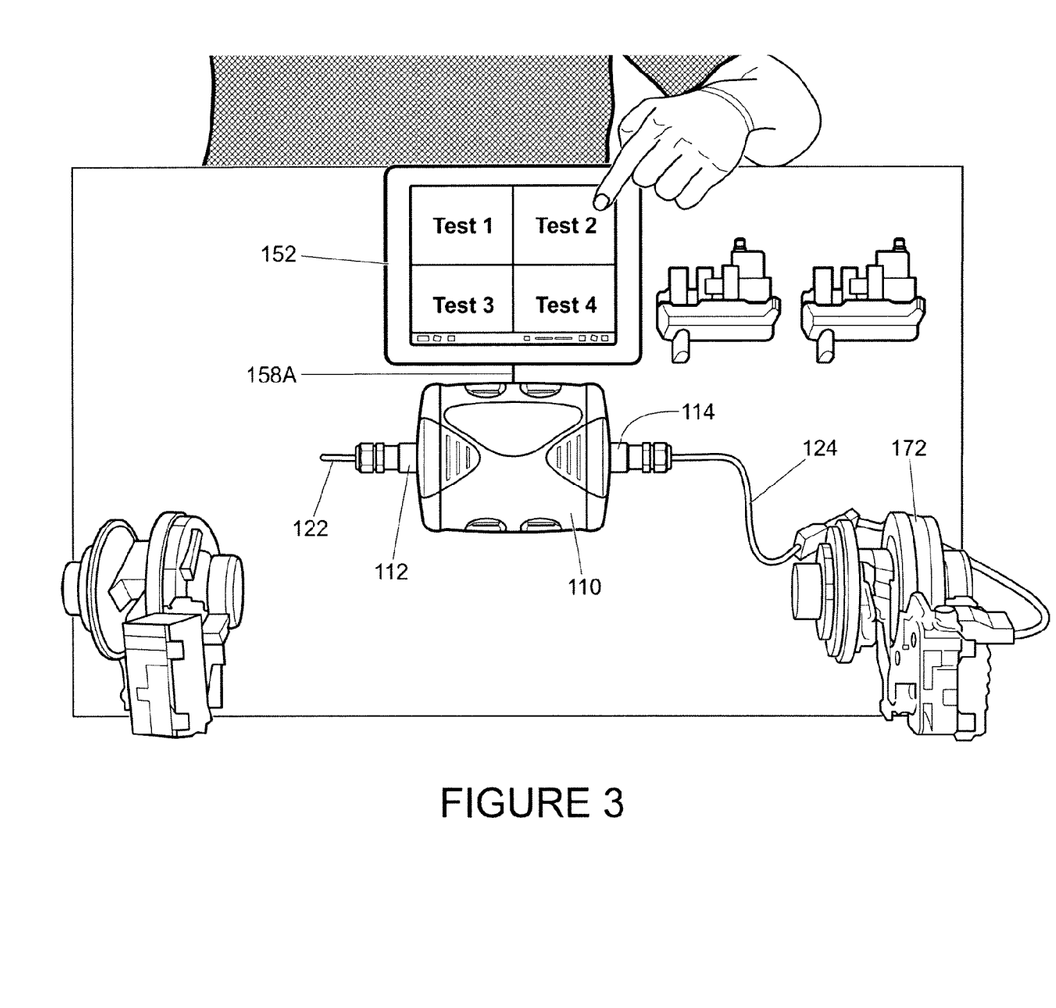
FIG. 3 is a schematic illustration of a diagnostics apparatus according to an embodiment of the invention connected to a turbocharger unit of a motor vehicle to perform a component test.

FIG. 3 shows an arrangement in which the diagnostics unit 110 is shown with the second cable 124 connected to the turbocharger unit 172 but the first cable 122 disconnected from the harness 170H. The diagnostics unit 110 is still connected to the computing device 152 by means of the first USB cable 158A.

In the arrangement shown an operator is selecting a test 'Test 2' via a touchscreen of the computing device 152. In response to selection of Test 2, the computing device 152 commands the diagnostics unit 110 to apply a prescribed electrical potential to each signal line of the second cable 124. The unit 110 then monitors the amount of current drawn by each signal line from the unit 110. The unit 110 outputs to the computing device 152 data corresponding to the potential applied to each signal line and the corresponding amount of current drawn. The computing device 152 is configured to compare the amounts of current drawn and the potentials applied to each signal line with data corresponding to expected values and to provide an output indicative of whether the values correspond to expected values. The output may be in the form of a 'pass' or 'fail' indication for a given test. Thus if Test 2 is performed and the values of potential and current correspond to values expected of a correctly functioning turbocharger unit 172, the computing device 152 may provide an output indicating that the unit 172 has attained a 'pass' in respect of Test 2. If a different test (say Test 1) is performed and the values of potential and current do not correspond to values expected of a correctly functioning turbocharger unit 172, the computing device 152 may provide an output indicating that the unit 172 has attained a 'fail' in respect of Test 1.

When performing a component test, the unit 110 may be arranged to receive power from a battery of the vehicle or any other suitable source of power such as an internal or external battery or an external power supply unit.

Figure 4:
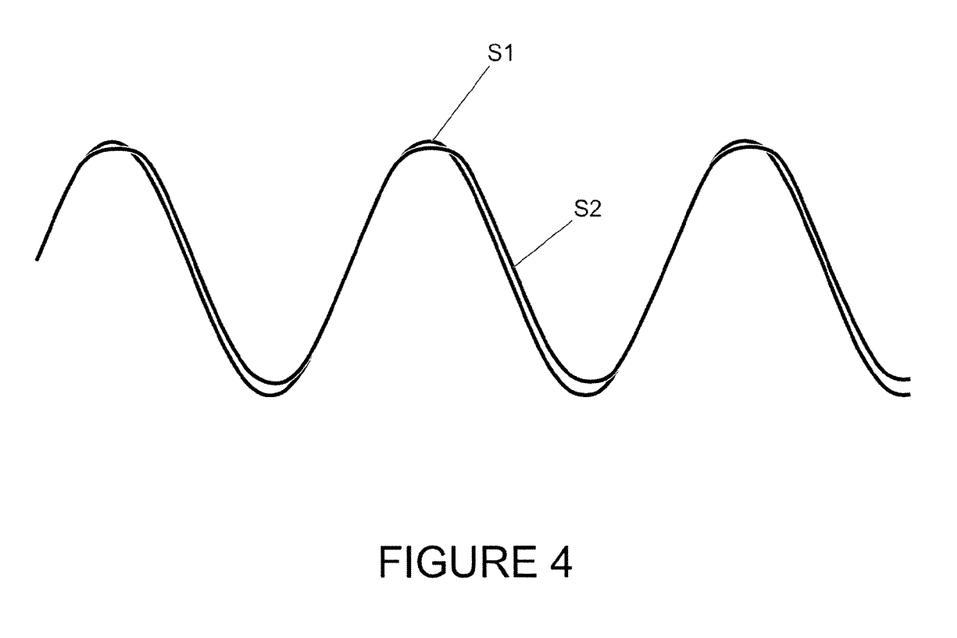
FIG. 4 is a plot of two signals output by a diagnostics apparatus according to an embodiment of the invention as a function of time during testing of a turbocharger unit.

FIG. 4 is a plot output by the diagnostics unit 110 showing two signals as a function of time during testing of a turbocharger unit 172 having a rotary electronic actuator (REA). The plot was generated by the computing device 152 in response to signals input to the computing device 152 in response to measurements made by the diagnostics unit 110.

The test involves the application of a sinusoidal test signal to an REA input signal line of the turbocharger unit 172 by the diagnostics unit 110. This signal is represented by trace S1. A potential at a feedback signal line is monitored by the diagnostics unit 110 and is represented on the plot by trace S2.

Figure 5:
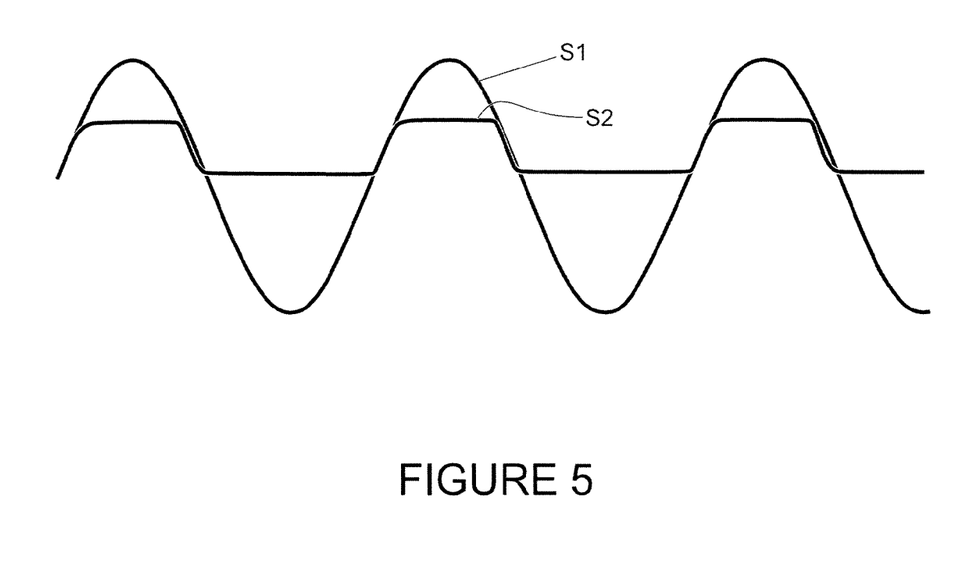
FIG. 5 is a corresponding plot to that of FIG. 4 with the diagnostics apparatus connected to a faulty turbocharger unit.

In the case of the test for which data is plotted in FIG. 4, the signal S2 detected at the feedback signal line was found to correspond to that of the test signal S1 to within three standard deviations ("3 sigma") and the turbocharger unit 172 was deemed to 'pass' the test. Other criteria may be applied in respect of correspondence between data in respect of detected signals and stored reference data. In some cases, the data may be required to correspond to within a prescribed number of standard deviations as in the present case. In some cases, an absolute value of a potential or current may be required to be within a prescribed range of allowable values. In some cases, for example where a signal line is carrying digital data, the computing device 152 may be arranged to determine whether the data being transmitted is correct data. For example, in the case of signals transmitted on one or more CAN bus signal lines, the computing device 15 may be configured to determine whether the data correspond to expected CAN bus data signals, FIG. 5 is a plot of the same two signals output by the diagnostics unit 110 with the diagnostics unit 110 connected to a faulty turbocharger unit 172. It can be seen that the potential measured at the feedback signal line S2 differs by more than three standard deviations from the potential applied to the REA input signal line, signal S1. Accordingly, the computing device 152 determines that, because the signal differs by more than three standard deviations, a fault exists with the turbocharger unit 172. A corresponding output is therefore provided by the computing device 152.

It is to be understood that in some embodiments it may be useful to measure the potential present on a signal line of the harness 170H even where the diagnostics unit 110 is arranged to apply a prescribed potential to that signal line. This is because a fault may be associated with a signal line within the turbocharger unit 172, for example a short to earth or to a 12V signal line. Thus if the computing device 152 determines that the diagnostics unit 110 is applying a potential of 5V to a signal line but the measured potential at the signal line is 0V, the computing device 152 may determine that the turbocharger unit 172 has suffered a short circuit to ground in respect of that particular signal line. It is to be understood that the diagnostics unit 110 is operable to present low impedance tracks between the first and second connector ports 112, 114 when measuring current flow through the harness 170H between components to which it is connected. In the event the unit 110 detects a short circuit or over-current state in a signal line the unit 110 (for example by detecting an increase in current and/or a decrease in potential difference) the unit 110 is configured to present a high impedance to that signal line in order to prevent damage to the unit 110. By over-current is meant that excessive current (i.e. current exceeding a prescribed value) is being drawn from the unit 110 through a signal line connected thereto. In some embodiments if the unit 110 detects an amount of current flowing through the unit 110 via the first and second ports 112, 114 that exceeds a prescribed value, the unit 110 may be configured to present a high impedance at that signal line. In some embodiments the impedance may be sufficiently high substantially to prevent current flow through that signal line. Other arrangements are also useful.

The diagnostics unit 110 may be provided with a memory in which data obtained by the unit 110 in respect of electrical potential of a given signal line and/or current flowing through a given signal line as a function of time may be stored. Alternatively or in addition the diagnostics unit 110 may be configured to output to the computing device 152 data in respect of electrical potential of a given signal line and/or current flowing through a given signal line, the computing device 152 being configured to store (or 'log') the data. In the embodiment of FIG. 1, the diagnostics unit 110 is configured to communicate with the computing device 152 exclusively by transmission of digital data across the USB cable 158A using the USB communications protocol.

In the event the computing device 152 determines that a fault is associated with the harness 170H, the apparatus may be employed to determine a location of the harness at which the fault is present. In order to do this, the apparatus is configured substantially as shown in FIG. 2 with the diagnostics unit 110 connected in the harness 170H between the ECU 171 and turbocharger unit 172. The computing device 152 commands the ECU 171 to set signal lines of the harness 170H to prescribed potentials, and the diagnostics unit 110 monitors the potential of each signal line at the first port 112 of the unit 110. The diagnostics unit 110 outputs to the computing device 152 data corresponding to the potential at each signal line at the first port 112. The computing device 152 may be controlled to provide a visual representation of the data (such as a graphical plot of the data) as a function of time, allowing an operator to check that the values meet a required specification.

In some embodiments, the computing device 152 may be operable to provide an audible and/or visual alert in the event that one or more of the signals are found to have a value outside of an allowable range.

Figure 6:
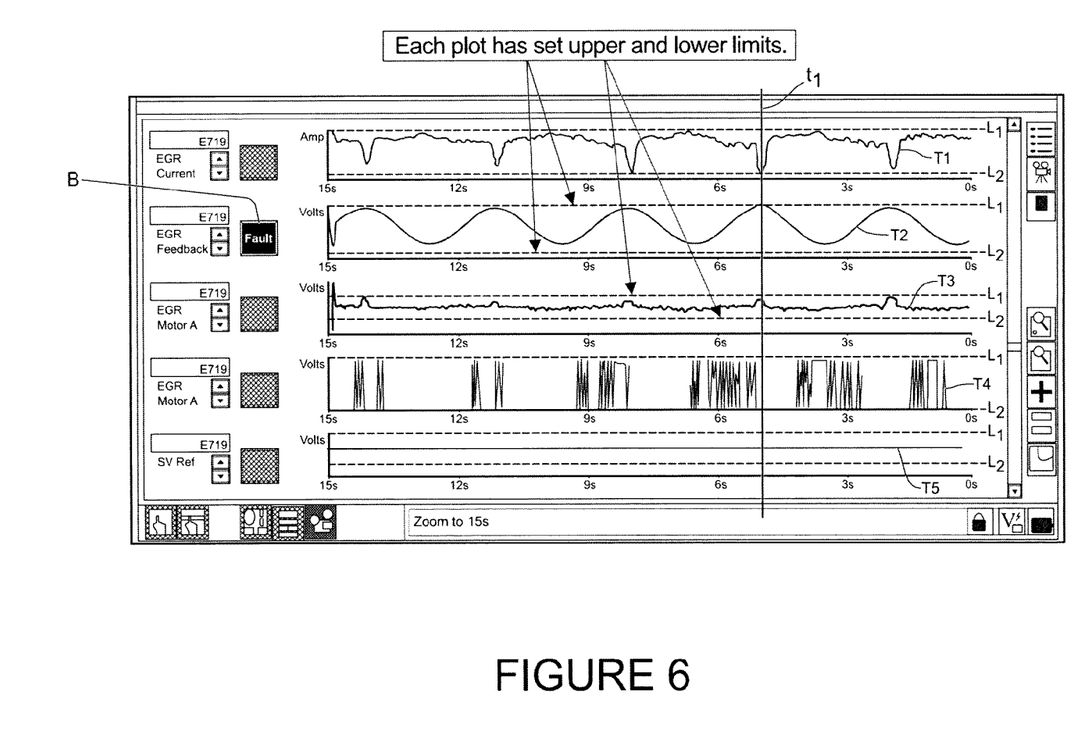
FIG. 6 is plot of five signals as a function of time during a real-time test to determine a location of a fault in a harness.

FIG. 6 is a screenshot taken from the computing device 152 during the testing of the harness 170H with the diagnostics unit connected between an ECU and an exhaust gas recirculation (EGR) valve unit. It can be seen that the computing device displays five respective traces, traces T1 to T5. Trace T1 is a plot of EGR valve unit current drawn by a signal line as a function of time; trace T2 is a plot of EGR unit feedback voltage as a function of time; traces T3 and T4 show traces of a PWM voltage signal provided to the EGR valve unit; and trace T5 is a plot of a reference potential applied to the EGR unit as a function of time. The reference potential is set to remain at 5V substantially continuously during the test in the configuration shown.

Dashed upper and lower lines L1, L2 respectively in each plot indicate the upper and lower values of the parameter plotted (whether electrical potential difference or current) as a function of time. In the plots shown in FIG. 6, time increases from right to left.

It can be seen that, at time t1, the value of EGR feedback potential plotted in trace T2 momentarily exceeded an upper limit indicated by corresponding dashed line L1. Therefore at time t1 the computing device 152 sets a fault indicator box B (left-hand side of trace T2 in the screenshot) to a fault indication state in which the box is displayed in a red colour with the word 'Fault' within the box B. An audible alert is also provided at substantially the same time.

In the present embodiment of the invention, the fault indicator box B remains set to the fault indication state until reset by an operator by pressing a prescribed key of a keyboard of the computing device 152. The audible alert is arranged to sound for a prescribed period of time each time one of the signals is detected to have a value outside of the range defined by the corresponding pair of dashed lines L1, L2. The prescribed period may be any suitable period such as a period of 1 s, 2 s, 5 s or any other suitable period.

The computing device 152 is operable to allow the operator to reset the state of the fault indicator box to a non-fault indication state when required.

It is to be understood that when diagnosing a fault with the harness 170H, an operator may apply forces to the harness 170H to seek to reproduce forces to which the harness 170H may be subject when the vehicle 170 is being driven, in order to try to cause a repeat of the phenomenon giving rise to the fault. Thus the operator may move the harness repeatedly, e.g. in a 'wiggle' action, to try to repeat the phenomenon.

As noted above, in some embodiments the diagnostics unit 110 may be operable to apply one or more signals to one or more signal lines of a controller area network (CAN) bus. This feature enables the unit 110 to reproduce electrical conditions associated with motor vehicle operation which may be required in order for correct functioning of a component. For example, in the event that actuation of an REA of a turbocharger unit 172 requires that the turbocharger unit 172 receive a CAN bus signal indicating an engine is running, the diagnostics unit 110 is operable to generate a corresponding CAN bus signal to enable the REA to be actuated in order to test the turbocharger unit 172.

In some embodiments, a test may be performed in which neither one of the diagnostics unit 110 and computing device 152 are required to issue commands to the ECU 171. In an embodiment, a software program, optionally in the form of one of a plurality of scripts for running different respective tests, is run on the computing device 152 with the diagnostics unit 110 connected to the harness 170H of the motor vehicle 170 substantially as shown in FIG. 2. The program or script run may correspond to a particular test that a user intends to perform. The computing device 152 is controlled by the software program run thereon to log data acquired by the diagnostics unit 110 in respect of electrical activity on the harness 170H. Thus, the computing device 152 may receive and store data in respect of current passing along one or more signal lines of the harness 170H, an electrical potential of one or more signal lines, data transmitted along one or more signal lines such as CAN or LIN bus signal lines, one or more actuation signals transmitted along a signal line such as a PWM actuation signal, a feedback signal generated by the component 172 such as an actuator position feedback signal, or any other suitable signal. Whilst the computing device 152 is logging the data, the user may themselves initiate a test procedure.

The test procedure may for example involve the user cycling an ignition system of the vehicle 170 in the case of a petrol-engined vehicle, for example by switching the ignition system on and off repeatedly, according to a prescribed test procedure corresponding to the software program being executed by the computing device 152. This may be performed for example by turning a key between 'ignition off' and 'ignition on' positions. Alternatively or in addition the test procedure may involve starting and stopping an engine of the vehicle 170, e.g. a petrol engine or a diesel engine in the case of a diesel-engined vehicle. Thus where the vehicle 170 has a key-actuated starter system, the test procedure may involve turning the key between 'off' and 'start' positions to start the engine, allowing the engine to run for a prescribed period, subsequently turning the key from an engine running position to the 'off' position. The engine running position may correspond to an 'ignition on' position in the case of a petrol-engined vehicle or an 'engine on' position in the case of a diesel-engined vehicle. Other arrangements are also useful.

Once the user has executed the prescribed test procedure, the computing device 152 may provide an output indicating whether electrical activity in respect of the signal lines of the harness 170H corresponds to a correctly functioning vehicle 170. In the event that the electrical activity does not correspond to that expected of a correctly functioning vehicle 170, the computing device 152 may provide an output indicating that the activity monitored does not correspond to a correctly functioning vehicle 170. The computing device 152 may also provide an indication as to why the electrical activity does not correspond to a correctly functioning vehicle 170. For example, in the case that an electrical potential of a power supply signal line is out of a prescribed range expected of a correctly functioning vehicle 170, the computing device 152 may be configured to provide a corresponding indication to a user, e.g. 'signal line #1 out of range'. Other indications are also useful.

In the case of tests in which the diagnostics unit 110 is connected in the harness 170H of the vehicle, detecting electrical activity of signal lines of the harness, data in respect of the following electrical activity may be monitored:

1. Component supply and ground: the computing device 152 may log data in respect of the power supply to a component 172, e.g. a signal line carrying a 12V power supply potential and a signal line carrying a ground signal. In some embodiments a component return signal line in respect of power supplied to the component 172 may be monitored.
2. Component feedback: the computing device 152 may log data in respect of a feedback signal line from a component 172. In the case the component 172 is a turbocharger unit, an electrical potential (relative to ground) of the feedback signal line may be controlled by a position sensor arranged to provide an indication of a position of vanes of the turbocharger, within a range defined by upper and lower limits.
3. Component current profile: the computing device 152 may log data in respect of an amount of current drawn by the component 172 as a function of time, to assist in diagnosing mechanical and/or electrical faults. For example, in the case of a component having an electrical motor, if the motor is drawing a higher current than expected in order to move a component to a target position, control a component to assume a target state, or achieve a target speed of rotation, it may be inferred that the motor may be acting against an unexpected mechanical resistance. The computing device 152 may therefore provide an indication that such a mechanical resistance may be present. In addition or instead the computing device 152 may provide an indication of an action to be completed by an operative, for example 'component motor replacement required' or 'component replacement required'. Other arrangements are also useful. It is to be understood that in some embodiments the computing device 152 may be arranged to determine an amount of power consumed by a motor or other component based on current supplied to the component and voltage across the component. This feature may enable the computing device 152 to compensate for fluctuations in voltage across the component in determining whether current drawn by the component is excessive.
4. Pulse Width Modulation (PWM) output from an ECU: the computing device 152 may monitor a PWM signal (or equivalent) applied to the component to actuate the component. If the PWM or other signal does not match the expected form of the signal to within a prescribed tolerance the computing device 152 may provide a corresponding indication.
5. Short circuit: the computing device 152 may be arranged to check whether the electrical potential of one or more signal lines is indicative of a short circuit, whether to ground or a non-zero supply or other potential.
6. Open circuit: the computing device 152 may be arranged to check whether the electrical potential of one or more signal lines is indicative of an open circuit, e.g. by detecting a substantially zero potential or a floating potential when a constant potential within a prescribed range is expected.
7. Actuator movement: the computing device 152 may be arranged to determine the position of an actuator of a component where the component has an actuator, by reference to one or more actuator position signal lines.

The computing device 152 may determine whether the position indicated corresponds to an allowable and/or expected position.

In the case that the diagnostics unit 110 performs a component test, being disconnected from the harness 170H, data in respect of the following electrical activity may be monitored:

1. Component Response Time: the computing device 152 may be arranged to monitor the response of an actuator of a component or other portion to an initial request sent by the diagnostics unit 110, in order to assess whether a fault is present; the computing device 152 may monitor the response at least in part by monitoring a potential difference at one or more signal lines and an amount of current flowing therethrough.
2. Component Slew Rate: the computing device may monitor the rate of change of voltage and/or current in respect of one or more signal lines to detect a fault. The form of the variation in potential or current as a function of time may be characterized by the apparatus in order to determine whether an electrical or mechanical fault is present. For example an increase in current draw whilst an actuator is moving to a predetermined position may suggest that a mechanical resistance is present. The rate of change of voltage, current and/or power consumption (wattage) may differ when an actuator or other portion is moved in different directions, providing an indication of the presence of a fault, in some embodiments.
3. Actuator Sticking: the computing device 152 may be configured to identify a sticking actuator by reference to actuator position and amount of current drawn, as well as voltage measured. A sticking actuator may be caused by a mechanical malfunction within a component.
4. Feedback Errors: the computing device 152 may detect feedback errors in which a component fails to provide the correct position of an actuator, for example by not providing a value at all, or providing an incorrect value. The feedback signal may be compared by the device 152 with other measured signals such as current drawn.

In some embodiments, a cable test may be performed in which integrity of the first and second cables 122, 124 and connectors 122C, 124C associated therewith is tested.

In order to perform the test, the connectors 122C, 124C may be connected to one another. The diagnostics unit 110 then performs a self-test procedure in which one or more prescribed signals are applied to a signal line at the first or second connector port 112, 114. The diagnostics unit 110 then determines whether a corresponding signal is detectable at the other connector port 114, 112, indicating that the signal has been successfully transmitted by the first and second cables 122, 124. If the signal is not detected, or does not correspond to the transmitted signal to within a prescribed tolerance, the diagnostics unit 110 may generate a corresponding indication to the user such as an audible alert. Correct functioning of the first and second cables 122, 124 may be indicated by a corresponding audible alert or by any other suitable means.

In some embodiments, the diagnostics unit 110 is operable to facilitate testing of a harness 170H of a motor vehicle by simulating operation of a given component. Thus, in the case that it is required to investigate whether a fault is associated with a harness 170H, the diagnostics unit 110 may be connected to the harness 170H by means of the first or second connector port 112, 114 in place of a component. For example, if incorrect operation of a turbocharger unit 172 is suspected, the diagnostics unit 110 may be connected to the harness 170H in place of the turbocharger unit 172. The diagnostics unit 110 may then monitor one or more of the electrical signal lines of the harness 170H such as a voltage supply signal line and/or a ground signal line. The diagnostics unit 110 may itself generate an appropriate response to one or more signals detected, for example by applying one or more signals to one or more signal lines of the harness 170H.

In some embodiments, the diagnostics unit 110 may be connected to the computing device 152 and transmit data to the computing device 152 corresponding to one or more signals detected by the unit 110 via the connector port 112, 114 connected to the harness 170H, and optionally one or more signals generated by the unit 110 and applied to a signal line of the harness 170H. The computing device 152 may be configured to determine whether the signals detected by the diagnostics unit 110 correspond to signals expected of a correctly functioning harness 170H, and provide a corresponding indication to a user.

Thus if the signals are as expected, the computing device 152 may provide a corresponding audible and/or visual indication that the harness 170H is functioning correctly. If the signals are not as expected, the computing device 152 may provide a corresponding audible and/or visual indication that the harness 170H is not functioning correctly. If the diagnostics unit 110 and/or computing device 152 is able to determine the likely fault causing the harness 170H not to function correctly, a corresponding indication may be provided to a user.

Embodiments of the present invention provide diagnostics apparatus for diagnosing faults or features associated with a motor vehicle. Embodiments of the invention enable an operator to obtain positive confirmation that a controlled component is receiving an expected electrical input via a harness of the vehicle. In some embodiments a response of a component to an electrical input may be measured in order to confirm correct operation of the component. Embodiments of the present invention facilitate testing of a motor vehicle control system by installing a diagnostics unit in-line in the control system, for example in an electrical harness of the vehicle, and monitoring signals applied to signal lines of the harness. Some embodiments of the invention also allow testing of a component with the component and diagnostics unit disconnected from the harness. This facilitates, optionally in combination with the in-line measurements described above, a determination whether the fault is associated with the harness or the component.

It is to be understood that some embodiments of the present invention may be arranged to operate in conjunction with an existing diagnostics system, for example the Jaguar Land Rover (JLR) symptom driven diagnostics (SDD) system. The diagnostics system may, like the JLR SDD system, be connectable to a vehicle diagnostics port being a communications port of the vehicle control system. The computing device 152 may be provided by the existing system such as the JLR SDD system, subject to appropriate reprogramming to enable to the SDD system to function according to an embodiment of the present invention when connected to the diagnostics unit 110.

Embodiments of the present invention provide an efficient, cost effective means for understanding one or more features associated with motor vehicle operation such as a fault or other feature. Some embodiments involve a two stage diagnostics process in which a diagnostics unit is connected in-line in a motor vehicle control system to monitor signals transmitting between components. This can enable testing of the control system, for example a harness thereof, to determine whether the system is operating correctly. In a second stage, the diagnostics unit may in some embodiments be disconnected from the control system, and controlled to perform a component-only test. In one embodiment, an end-node test may be performed in addition or instead, in which the diagnostics unit is connected to the control system in place of one or more components. The diagnostics unit then checks that the control system in functioning correctly. The diagnostics unit may generate signals and provide them to the control system (for example via a vehicle harness) to simulate the presence of a component that has been disconnected. Other arrangements are also useful.

Embodiments of the invention may be understood by reference to the following numbered paragraphs:

1. A motor vehicle diagnostics apparatus having a diagnostics unit connectable in-line in a motor vehicle control system between first and second components,
   the apparatus being operable to detect by means of the diagnostics unit one or more electrical signals generated by the first component for application to the second component and to provide an output in response to the detected signals.

2. Apparatus according to claim 1 connectable to a harness of the control system in-line between the first and second components.

3. Apparatus according to claim 1 further operable to detect by means of the diagnostics unit one or more electrical signals generated by the second component for application to the first component and to provide an output in response to the detected signals.

4. Apparatus as according to claim 1 operable to log data in respect of the signals detected.

5. Apparatus according to claim 1 operable to provide an indication whether the detected signals correspond to expected signals by reference to data in respect of expected signals.

6. Apparatus according to claim 1 operable to provide a visual indication of a correspondence between a form of a signal detected by the diagnostics unit and an expected form of the signal.

7. Apparatus according to claim 1 operable to provide a visual or audible indication whether a value of at least one characteristic of a detected signal is within a prescribed range of values of that characteristic.

8. Apparatus according to claim 7 operable to provide the visual or audible indication by reference to the data in respect of expected signals.

9. Apparatus according to claim 1 further connectable to an input portion of a vehicle controller, the apparatus being operable to provide one or more communications signals to the controller.

10. Apparatus according to claim 9 wherein the input portion is an external communications port of a vehicle control system.

11. Apparatus according to claim 9 operable to correlate communications signals provided to the controller by the apparatus with signals detected by the diagnostics unit.

12. Apparatus according to claim 9 operable to download data from the vehicle controller.

13. Apparatus according to claim 12 operable to download data comprising a fault code.

14. Apparatus according to claim 1 further comprising a diagnostics control module connectable to the diagnostics unit.

15. Apparatus according to claim 14 wherein the control module is operable to log the data in respect of the signals detected by the diagnostics unit.

16. Apparatus according to claim 9 further comprising a diagnostics control module connectable to the diagnostics unit, wherein the diagnostics control module is connectable to the input portion of the vehicle controller, the module being operable to provide the one or more control signals to the controller.

17. Apparatus according to claim 1 operable to generate one or more signals for application to the first component.

18. Apparatus according to claim 17 operable to generate one or more signals to simulate one or more signals that may be generated by the second component and to apply the one or more signals to the first component.

19. Apparatus according to claim 18 operable to apply the one or more signals to the first component with the second component disconnected from the unit.

20. Apparatus according to claim 1 operable to communicate with a controller area network bus.

21. Apparatus according to claim 20 operable to transmit via the controller area network bus one or more messages that may otherwise be transmitted by a component thereby to simulate operation of the component.

22. Apparatus according to claim 1 wherein the diagnostics unit is operable to apply one or more electrical signals to the second component.

23. Apparatus according to claim 22 operable to monitor at least one characteristic of one or more signals generated by the second component as a function of time in response to the one or more signals applied thereto by the unit.

24. Apparatus according to claim 23 wherein the apparatus is operable to provide an output indicative of whether the at least one characteristic of the one or more signals generated by the second component as a function of time corresponds to an expected characteristic.

25. Apparatus according to claim 22 operable to monitor at least one characteristic associated with a signal applied to the second component as a function of time and to provide an output indicative of whether the at least one characteristic corresponds to an expected characteristic.

26. Apparatus according to claim 1 coupled electrically to a motor vehicle.

27. A method of diagnosing a fault associated with a motor vehicle by means of diagnostics apparatus comprising:
   connecting a diagnostics unit of the apparatus in-line in a motor vehicle control system between first and second components; and
   detecting by means of the diagnostics unit one or more electrical signals generated by the first component for application to the second component; and
   providing an output corresponding to the detected signals.

28. A method according to claim 27 comprising further connecting the apparatus to an input portion of a vehicle controller, and providing one or more communications signals to the controller.

Throughout the description and claims of this specification, the words "comprise" and "contain" and variations of the words, for example "comprising" and "comprises", means "including but not limited to", and is not intended to (and does not) exclude other moieties, additives, components, integers or steps.

Throughout the description and claims of this specification, the singular encompasses the plural unless the context otherwise requires. In particular, where the indefinite article is used, the specification is to be understood as contemplating plurality as well as singularity, unless the context requires otherwise.

Features, integers, characteristics, compounds, chemical moieties or groups described in conjunction with a particular aspect, embodiment or example of the invention are to be understood to be applicable to any other aspect, embodiment or example described herein unless incompatible therewith.

The invention claimed is:

1. A motor vehicle diagnostics apparatus comprising:
   a diagnostics unit including first and second connector ports, the connector ports being used for connecting the diagnostics unit in line in a motor vehicle control system between first and second vehicle components of the vehicle control system with the first connector port between the first vehicle component and the diagnostics unit and the second connector port between the second vehicle component and the diagnostics unit;
   the apparatus being operable to detect by means of the diagnostics unit one or more electrical signals generated by the first component for application to the second component and to provide an output in response to the detected signals; and
   wherein the apparatus is operable to perform a test of at least one cable and/or connector connecting the first connector port to the second connector port by transmitting a signal from the first connector port to the second connector port via said at least one cable and/or connector, in use.

2. An apparatus according to claim 1, wherein the diagnostics unit is connectable to a harness of the control system in-line between the first and second components.

3. An apparatus according to claim 1, operable to detect by means of the diagnostics unit one or more electrical signals generated by the second component for application to the first component and to provide an output in response to the detected signals.

4. An apparatus as according to claim 1, operable to log data in respect of the signals detected.

5. An apparatus according to claim 1, operable to provide one or more of:
   an indication whether the detected signals correspond to expected signals by reference to data in respect of expected signals;
   a visual indication of a correspondence between a form of a signal detected by the diagnostics unit and an expected form of the signal; and
   a visual or audible indication whether a value of at least one characteristic of a detected signal is within a prescribed range of values of that characteristic, optionally, the visual or audible indication by reference to the data in respect of expected signals.

6. An apparatus according to claim 1, connectable to an input portion of a vehicle controller, the apparatus being operable to provide one or more communications signals to the controller, optionally, wherein the input portion is an external communications port of a vehicle control system.

7. An apparatus according to claim 6, operable to correlate communications signals provided to the controller by the apparatus with signals detected by the diagnostics unit.

8. An apparatus according to claim 6, operable to download data from the vehicle controller, optionally, the download data comprise a fault code.

9. An apparatus according to claim 1, comprising a diagnostics control module connectable to the diagnostics unit.

10. An apparatus according to claim 9, wherein the control module is operable to log the data in respect of the signals detected by the diagnostics unit.

11. An apparatus according to claim 9, connectable to an input portion of a vehicle controller, the apparatus being operable to provide one or more communications signals to the controller, wherein the diagnostics control module is connectable to the input portion of the vehicle controller, the module being operable to provide the one or more control signals to the controller.

12. An apparatus according to claim 1, operable to generate one or more signals for application to the first component; and operable to generate one or more signals to simulate one or more signals that may be generated by the second component and to apply the one or more signals to the first component.

13. An apparatus according to claim 12, operable to apply the one or more signals to the first component with the second component disconnected from the unit.

14. An apparatus according to claim 1, operable to communicate with a controller area network bus, optionally, the apparatus is operable to transmit via the controller area network bus one or more messages that may otherwise be transmitted by a component thereby to simulate operation of the component.

15. An apparatus according to claim 1, wherein the diagnostics unit is operable to apply one or more electrical signals to the second component.

16. An apparatus according to claim 15, operable to monitor at least one characteristic of one or more signals generated by the second component as a function of time in response to the one or more signals applied thereto by the unit; and operable to monitor at least one characteristic associated with a signal applied to the second component as a function of time and to provide an output indicative of whether the at least one characteristic corresponds to an expected characteristic.

17. An apparatus according to claim 16, wherein the apparatus is operable to provide an output indicative of whether the at least one characteristic of the one or more signals generated by the second component as a function of time corresponds to an expected characteristic.

18. An apparatus according to claim 1, operable to perform a test of one of said first or second components whereby the component under test is disconnected from the motor vehicle control system and from the other component, and the component under test is connected to the diagnostics unit, optionally the component under test is a controller or a controlled component.

19. An apparatus according to claim 18, operable to simulate one or more signals that may be generated by the other component and to transmit the simulated one or more signals to the component under test.

20. A method of diagnosing a fault associated with a motor vehicle using a diagnostics apparatus, the method comprising:
performing a self-test of the apparatus comprising connecting a first connector port of a diagnostics unit of the apparatus to a second connector port of the diagnostics unit using at least one cable and/or connector and transmitting a signal from the first connector port for receipt at the second connector port;
connecting the diagnostics unit, using said first and second connector ports and said at least one cable and/or connector, in-line in a motor vehicle control system between first and second components;
detecting, using the diagnostics unit, one or more electrical signals generated by the first component for application to the second component; and
providing an output corresponding to the detected signals.

21. A method according to claim 20, comprising connecting the diagnostics unit to an input portion of a vehicle controller, and providing one or more communications signals to the controller.

22. An apparatus for diagnosing a fault associated with a motor vehicle, the apparatus comprising a diagnostics unit connectable in-line to a motor vehicle control system comprising first and second components, the diagnostics unit being connectable in place of one of the first or second components, the apparatus being operable to perform a test of one of the first or second components whereby the component under test is disconnected from the motor vehicle control system and from the other component, and the component under test is connected to the diagnostics unit, wherein the diagnostics unit is operable to simulate one or more signals that may be generated by the other component and to transmit the simulated signals to the component under test.

23. A method according to claim 20, wherein connecting the diagnostics unit comprises connecting the first connector port of the diagnostics unit between the first component and the diagnostics unit and connecting the second connector port between the second component and the diagnostics unit.

* * * * *

UNITED STATES PATENT AND TRADEMARK OFFICE
CERTIFICATE OF CORRECTION

PATENT NO. : 9,639,996 B2  
APPLICATION NO. : 14/765101  
DATED : May 2, 2017  
INVENTOR(S) : Jason Treharne Page 1 of 1

It is certified that error appears in the above-identified patent and that said Letters Patent is hereby corrected as shown below:

In the Claims

In Claim 10, Column 19, Line 2; before "data" delete "the"

In Claim 11, Column 19, Line 9; after "one or more" replace "control" with --communications--

Signed and Sealed this  
Tenth Day of October, 2017

Joseph Matal  
*Performing the Functions and Duties of the*  
*Under Secretary of Commerce for Intellectual Property and*  
*Director of the United States Patent and Trademark Office*